US012802730B2

(12) United States Patent
Chan

(10) Patent No.: US 12,802,730 B2
(45) Date of Patent: Nov. 17, 2026

(54) MEMORY DEVICE AND WORD LINE SIGNAL GENERATING METHOD THEREOF

(71) Applicant: Winbond Electronics Corp., Taichung City (TW)

(72) Inventor: Kai-Lin Chan, Hsinchu County (TW)

(73) Assignee: Winbond Electronics Corp., Taichung City (TW)

( * ) Notice: Subject to any disclaimer, the term of this patent is extended or adjusted under 35 U.S.C. 154(b) by 113 days.

(21) Appl. No.: 18/969,311

(22) Filed: Dec. 5, 2024

(65) Prior Publication Data

US 2026/0031121 A1 Jan. 29, 2026

(30) Foreign Application Priority Data

Jul. 26, 2024 (TW) ................................ 113127847

(51) Int. Cl.
*G11C 8/08* (2006.01)
*G11C 8/10* (2006.01)
*G11C 8/18* (2006.01)

(52) U.S. Cl.
CPC .................. *G11C 8/10* (2013.01); *G11C 8/08* (2013.01); *G11C 8/18* (2013.01)

(58) Field of Classification Search
CPC .... G11C 8/10; G11C 8/08; G11C 8/18; G11C 7/08; G11C 7/1018; G11C 7/22
See application file for complete search history.

(56) References Cited

U.S. PATENT DOCUMENTS 7,082,064 B2 7/2006 Nagrani et al.
7,224,635 B2 5/2007 Lambrache et al.
7,304,904 B2 12/2007 Lambrache et al.
7,397,723 B2 7/2008 Lambrache et al.
10,276,223 B2 4/2019 Hong
10,515,677 B2 12/2019 Hong
11,004,488 B2 5/2021 Hong
(Continued)

FOREIGN PATENT DOCUMENTS

JP 4924838 4/2012
TW 200639872 11/2006
TW 201839761 11/2018

OTHER PUBLICATIONS

Masanao Yamaoka et al., "Low-Power Embedded SRAM Modules with Expanded Margins for Writing", 2005 IEEE International Solid-State Circuits Conference, Feb. 9, 2005, pp. 480, 481 and 611.
(Continued)

*Primary Examiner* — Khamdan N. Alrobaie
(74) *Attorney, Agent, or Firm* — JCIPRNET

(57) ABSTRACT

A memory device and a word line signal generating method thereof are provided. The memory device includes a memory cell array, an X decoder, a Y decoder, a sense amplifier and a controller. The word line signal decoder provides a plurality of word line signals on word lines, respectively. The Y decoder respectively adjusts pulse widths of one or more Y select signals according to at least one pulse width control information. The controller generates each of the pulse width control information according to at least one bit of address information of each of the word lines. Wherein, a pulse width of each of the Y select signals is positive correlated to a distance between each of the word lines and the sense amplifier.

7 Claims, 7 Drawing Sheets

(56) References Cited

U.S. PATENT DOCUMENTS

| | | | | |
|---|---|---|---|---|
| 11,501,822 | B2 * | 11/2022 | Jia | G11C 11/4085 |
| 11,727,970 | B2 | 8/2023 | Hong | |
| 2006/0274574 | A1 * | 12/2006 | Choi | G11C 13/0023<br>365/163 |
| 2007/0247958 | A1 * | 10/2007 | Lee | G11C 7/22<br>365/230.06 |
| 2008/0278997 | A1 * | 11/2008 | Katagiri | G11C 7/22<br>365/163 |
| 2009/0034347 | A1 | 2/2009 | Demone | |
| 2013/0039137 | A1 * | 2/2013 | Yasuda | G11C 7/08<br>365/207 |
| 2018/0308533 | A1 * | 10/2018 | Hong | G11C 8/10 |
| 2023/0144366 | A1 | 5/2023 | Lee et al. | |

OTHER PUBLICATIONS

Masanao Yamaoka et al., "90-nm Process-Variation Adaptive Embedded SRAM Modules With Power-Line-Floating Write Technique", IEEE Journal of Solid-State Circuits, Mar. 2006, pp. 705-711, vol. 41, No. 3.

"Office Action of Taiwan Counterpart Application", issued on Jun. 17, 2025, p. 1-p. 10.

* cited by examiner

MEMORY DEVICE AND WORD LINE SIGNAL GENERATING METHOD THEREOF

CROSS-REFERENCE TO RELATED APPLICATION

This application claims the priority benefit of Taiwan application serial no. 113127847, filed on Jul. 26, 2024. The entirety of the above-mentioned patent application is hereby incorporated by reference herein and made a part of this specification.

BACKGROUND

Technical Field

The disclosure relates to a memory device and a Y select signal generating method, and particularly relates to a memory device adapted to save an access time and a Y select signal generating method thereof.

Description of Related Art

In a memory device, as a number of memory cells increases, different memory cells may have certain distance differences from a sense amplifier due to their layout positions. In this case, when an accessing operation is performed on each memory cell, a corresponding data response time may have certain differences due to the different layout positions of the memory cells.

In the conventional technical field, in order to ensure that all memory cells may be read and accessed correctly, a designer may set a response time of the accessing operation of each memory cell based on the worst situation. Such approach may consume unnecessary waiting time when performing the accessing operation on memory cells with fast response rates, thereby reducing performance and power consumption of the memory device.

SUMMARY

The disclosure is directed to a memory device and a word line signal generating method thereof, which are adapted to effectively save power consumption required for accessing operations of the memory device.

The disclosure provides a memory device including a memory cell array, an X decoder, a Y decoder, a sense amplifier, and a controller. The memory cell array is coupled to a plurality of word lines. The X decoder respectively provides a plurality of word line signals on the word lines. The Y decoder adjusts a pulse width of one or a plurality of Y select signals according to at least one pulse width control information. The sense amplifier is coupled to one side of the memory cell array through a plurality of bit lines. The controller is coupled to the X decoder and the Y decoder, and generates each pulse width control information corresponding to each of the Y select signals according to at least one bit in address information of each of the word lines. A pulse width of each of the Y select signals is positively related to a distance between each of the word lines and the sense amplifier.

The disclosure provides a word line signal generating method including: providing an X decoder to respectively provide a plurality of word line signals on a plurality of word lines; enabling a Y decoder to respectively adjust a pulse width of one or a plurality of Y select signals according to at least one pulse width control information; providing a controller to generate each pulse width control information corresponding to each of the Y select signals according to at least one bit in address information of each of the word lines, wherein a pulse width of each of the Y select signals is positively related to a distance between each of the word lines and the sense amplifier.

Based on the above description, the memory device of the disclosure may adaptively adjust the pulse width of the Y select signal according to one or more bits of the address information corresponding to the word line. In this way, the pulse width of each of the Y select signals may be positively related to the distance between each of the turned-on word lines and the sense amplifier. A time of an accessing operation performed by each word line may be adaptively adjusted according to a position of the word line, which effectively saves a time required for data access, saves the power consumption required, and improves working efficiency of the memory device.

DESCRIPTION OF THE EMBODIMENTS

Figure 1:
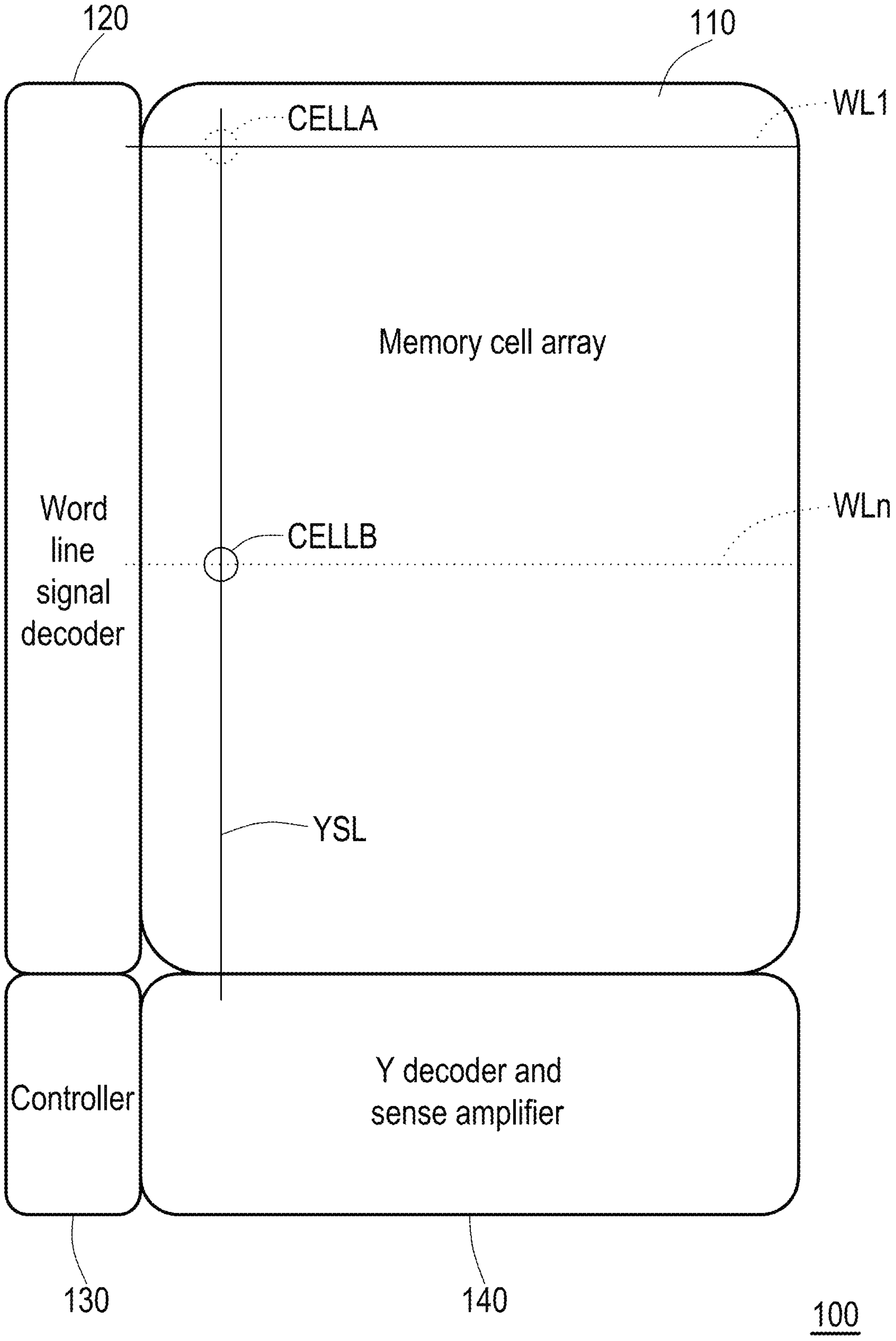
FIG. 1 is a schematic diagram of a memory device according to an embodiment of the disclosure.

Referring to FIG. 1, FIG. 1 is a schematic diagram of a memory device according to an embodiment of the disclosure. A memory device 100 includes a memory cell array 110, a word line signal decoder 120, a controller 130, and a Y decoder and sense amplifier 140. The memory cell array 110 includes a plurality of memory cell columns and a plurality of memory cell rows. The memory cell array 110 is coupled to a plurality of word lines WL1-WLn. The plurality of word lines WL1-WLn may be arranged in parallel to each other in the memory cell array 110. The word line signal decoder 120 may be referred to as an X decoder and may be coupled to the memory cell array 110 through the word lines WL1-WLn. The word line signal decoder 120 may provide word line signals to the word lines WL1-WLn. The word lines WL1 and WLn are respectively coupled to memory cells CELLA and CELLB at different positions. When an accessing operation is performed on the memory cell on any one of the word lines WL1-WLn, the word line signal decoder 120 may make the word line signal on the corresponding word lines WL1-WLn to have a positive pulse wave. A pulse width of the positive pulse wave may be set according to a time required for the accessing operation performed on the memory cell. For example, a maintaining time of the positive pulse wave of the word line signals on the turned-on word lines WL1-WLn may be greater than the time required for the accessing operation performed on the memory cell.

In the embodiment, in the Y decoder and sense amplifier 140, the Y decoder may correspond to different one or more pulse width control information to respectively adjust the pulse width of the word line signal, where the pulse width control information is configured to control a maintaining time of a positive pulse width on the Y select signal.

The Y decoder and sense amplifier 140 are disposed on one side of the memory cell array 110. In the embodiment, a Y decoder in the Y decoder and sense amplifier 140 may be disposed between the memory cell array 110 and a sense amplifier. The Y decoder may be configured to decode according to address information in a Y direction, and make in a Y select signal YSL corresponding to the address information in the Y direction to generate a positive pulse wave, and transmit the corresponding one or a plurality of bit line signals to the sense amplifier.

In the embodiment, the Y decoder and sense amplifier 140 is disposed adjacent to a side of the word line WLn. Therefore, a distance between the Y decoder and sense amplifier 140 and the word line WL1 is greater than a distance between the sense amplifier and the word line WLn.

The controller 130 is coupled to the word line signal decoder 120. The controller 130 is configured to generate each pulse width control information corresponding to the Y select signal YSL according to one or more bits in the address information of each of the turned-on word lines WL1-WLn.

It should be noted here that when the Y decoder and sense amplifier 140 is to perform a data accessing operation on the memory cell on the word line WL1, since the Y decoder and sense amplifier 140 is relatively far away from the word line WL1, the signal on the bit line corresponding to the memory cell has a relatively large transmission delay. Therefore, the memory cell on the word line WL1 requires a relatively long accessing operation time. Therefore, the Y decoder in the Y decoder and sense amplifier 140 may make the positive pulse wave on the corresponding Y select signal YSL to have a relatively long pulse width according to the address information of the word line WL1. On the other hand, when the Y decoder and sense amplifier 140 is to perform the data accessing operation of the memory cell on the word line WLn, since the Y decoder and sense amplifier 140 is relatively close to the word line WLn, the signal on the bit line corresponding to the memory cell has a relatively small transmission delay. Therefore, the memory cell on the word line WLn only require a relatively short accessing operation time. Therefore, the Y decoder may make the positive pulse wave on the corresponding Y select signal YSL to have a relatively short pulse width according to the address information of the word line WLn, thereby saving the time and power consumption required by the memory device 100 to perform operations.

In detail, the pulse width of the Y select signal YSL may be controlled by the Y decoder according to the pulse width control information corresponding to the turned-on word lines WL1-WLn. The pulse width control information is generated by the controller 130. The controller 130 may generate the pulse width control information based on one or more bits of the address information of the scanned word line. For example, taking the memory cell array 110 having 1024 word lines as an example, the word lines WL1-WL1024 and the corresponding address information may be as shown in a following table:

| | Address information X[9, 8, 7:0] | |
|---|---|---|
| | Decimal | Hexadecimal |
| WL1024 | 1023 | 3FF |
| . . . | . . . | . . . |
| WL769 | 768 | 300 |
| WL768 | 767 | 2FF |
| . . . | . . . | . . . |
| WL513 | 512 | 200 |
| WL512 | 511 | 1FF |
| . . . | . . . | . . . |
| WL257 | 256 | 100 |
| WL256 | 255 | 0FF |
| . . . | . . . | . . . |
| WL1 | 0 | 000 |

In the embodiment, by selecting two of the most significant bits (i.e., bits X[9:8]) in the address information X[9:0], the word lines WL1-WL1024 may be divided into four groups. The bits X[9:8]=0, 0 correspond to the word lines WL1-WL256; bits X[9:8]=0, 1 correspond to the word lines WL257-WL513; bits X[9:8]=1, 1 correspond to the word lines WL769-WL1024.

From the above-mentioned allocation method of the four groups, it may be known that through the bits X[9:8], the controller 130 may learn a distance relationship between the corresponding word lines WL1-WL1024 and the Y decoder and sense amplifier 140. Accordingly, the controller 130 may generate corresponding pulse width control information corresponding to the bits X[9:8] of different logic value combinations.

In other embodiments of the disclosure, the controller 130 may also choose to use different numbers of the most significant bits in the address information X[9:0] of different numbers, such as 1 or 2 or more, as the basis for generating the pulse width control information. Correspondingly, the word lines WL1-WL1024 may be divided into 2" groups according to the n most significant bits in the address information X[9:0].

The memory device 100 in the embodiment of the disclosure may be any form of memory device without certain limitations.

Figure 2:
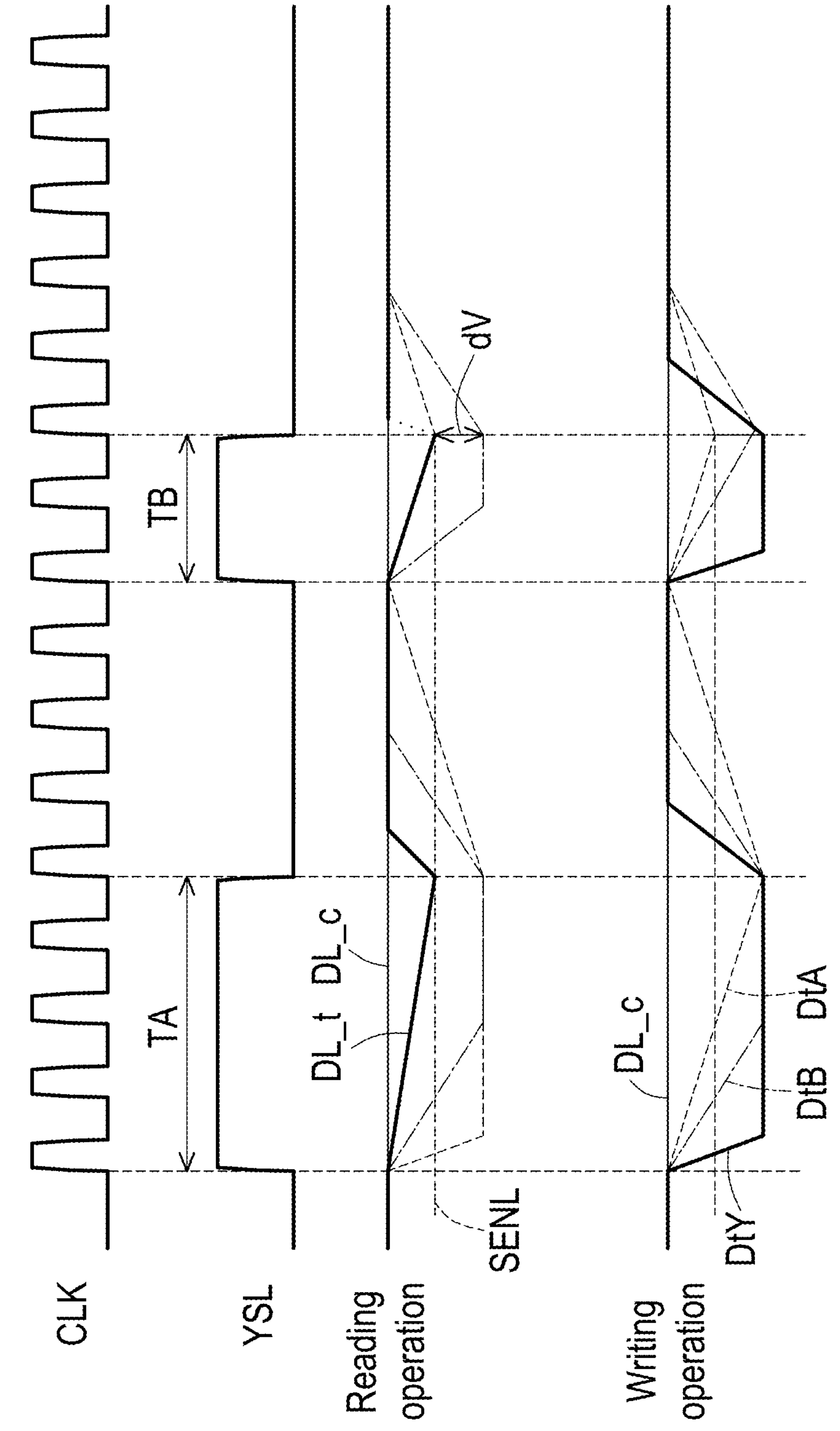
FIG. 2 is a waveform diagram of an accessing operation of a memory device according to an embodiment of the disclosure.

Referring to FIG. 2 below, FIG. 2 is a waveform diagram of an accessing operation of a memory device according to an embodiment of the disclosure. Corresponding to the memory device 100 of FIG. 1, the accessing operation of the memory device 100 may be performed based on a clock signal CLK. The controller 130 may transmit the pulse width control information to the Y decoder, and enable the Y decoder to adjust the pulse width of the Y select signal YSL according to the pulse width control information corresponding to the turned-on word line. In addition, the word line signal decoder 120 may make the maintaining time of the positive pulse width corresponding to the turned-on word line to be greater than or equal to the pulse width of the Y select signal YSL on a time axis.

In a reading operation, the controller 130 may first read a memory cell CELLA, and the word line signal decoder 120 makes the word line signal on the word line WL1 to generate a positive pulse wave, and in a time interval TA therein, generates a Y select signal YSL having a pulse width corresponding to the pulse width control information. A data signal DL_t sensed by the Y decoder and sense amplifier 140 may have a gradually decreased voltage value, while an inverted data signal DL_c may maintain a fixed reference voltage value. When the data signal DL_t drops to a sensing voltage value SENL, the Y decoder and sense amplifier 140 may complete the sensing operation of reading data from the memory cell CELLA. Since the memory cell CELLA is relatively far away from the Y decoder and sense amplifier 140, the Y decoder may control a maintaining time of the pulse width of the Y select signal YSL to have a relatively long time, so that the sensing operation of the reading data of the memory cell CELLA may be completed smoothly.

In addition, during the reading operation, the controller 130 may then read a memory cell CELLB, and the word line signal decoder 120 makes the word line signal on the word line WLn to generate a positive pulse wave, and in a time interval TB, the Y decoder generates a Y select signal YSL having a pulse width corresponding to the pulse width control information. The data signal DL_t sensed by the Y decoder and sense amplifier 140 may have a gradually decreased voltage value, while the inverted data signal DL_c may maintain a fixed reference voltage value. Since the memory cell CELLB is relatively close to the Y decoder and sense amplifier 140, the voltage value of the data signal DL_t may quickly drop to be equal to the sensing voltage value SENL. The Y decoder may control the maintaining time of the pulse width of the Y select signal YSL to have a relatively short time, so that the sensing operation of reading data of the memory cell CELLB may be completed smoothly. Therefore, the Y decoder and sense amplifier 140 may quickly complete the sensing operation of the reading data of the memory cell CELLB in the time interval TB (the time interval TB is shorter than the time interval TA).

It should be noted that in the embodiment, when the reading operation is performed on the memory cell CELLB, a time length of the reading operation may be adaptively reduced. Therefore, the data signal DL_t may eliminate a drop value of a voltage dV, which effectively reduces power consumption.

On the other hand, in the writing operation, the controller may first write to the memory cell CELLA. In the time interval TA, a writing voltage DtY is provided to a coupling end of the Y decoder and sense amplifier 140 and the Y select signal YSL. Correspondingly, data signals DtA and DtB respectively received by the memory cell CELLA and the memory cell CELLB respectively have gradually decreased voltages. Based on the relatively far distance between the memory cell CELLA and the Y decoder and sense amplifier 140 compared to the memory cell CELLB, a voltage drop rate of the data signal DtA is smaller than a voltage drop rate of the data signal DtB. Therefore, it takes a relatively long time interval TA to complete the data writing operation of the memory cell CELLA.

In addition, based on the relatively short distance between the memory cell CELLB and the Y decoder and sense amplifier 140 compared to the memory cell CELLA, the voltage drop rate of the data signal DtB is greater than the voltage drop rate of the data signal DtA. Therefore, it only takes a relatively short time interval TB to complete the data writing operation of the memory cell CELLB.

It may be known from the above description that in the embodiment, by dynamically adjusting the pulse widths of multiple pulse waves of the turned-on word lines WL1-WLn at different positions in the Y select signal, the memory device 100 may effectively save the time required for accessing the memory cells, and may save the power consumption incurred during the accessing operation, thereby improving a working performance of the memory device 100.

Figure 3A:
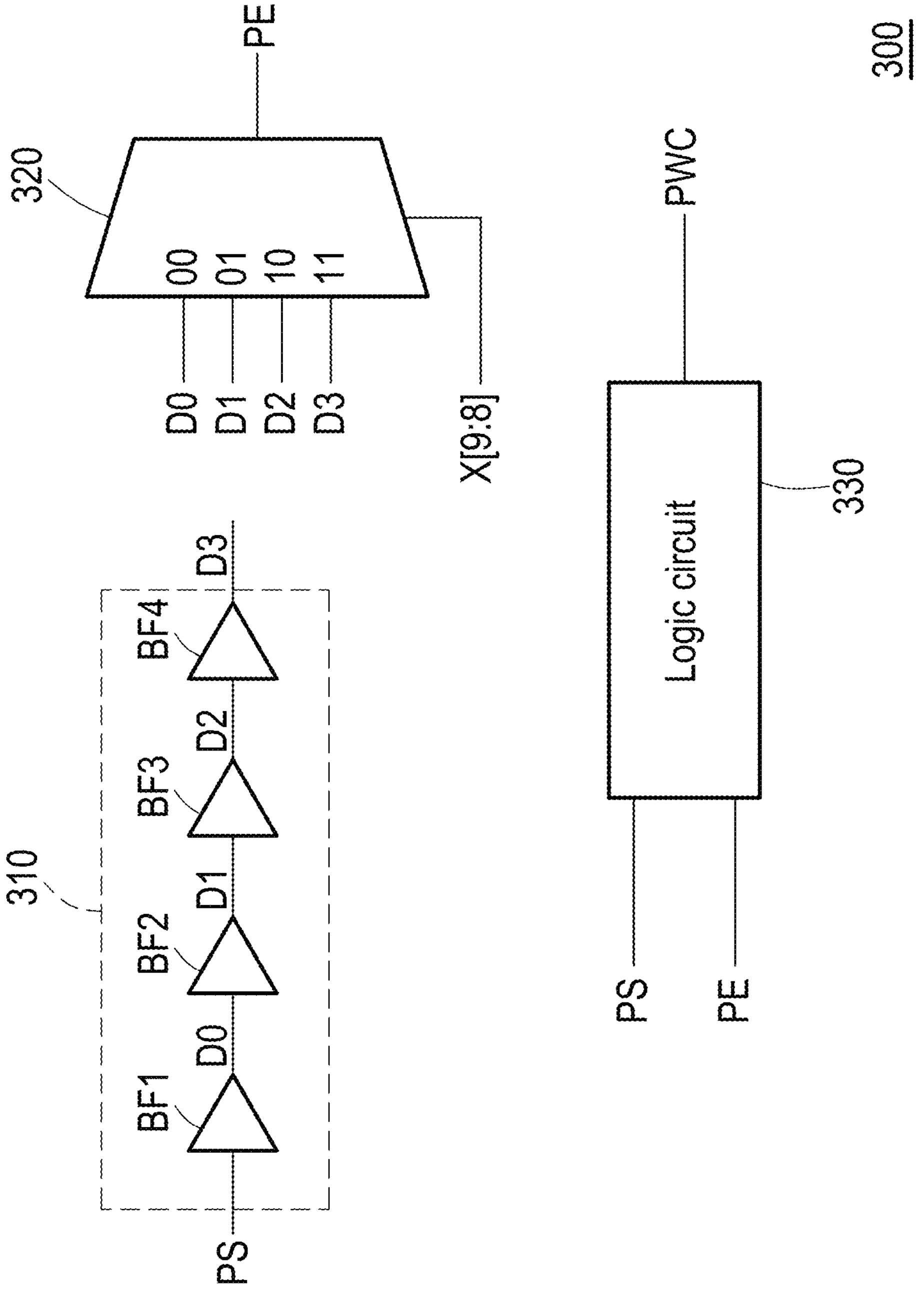
FIG. 3A is a schematic diagram of an implementation of a controller of a memory device according to an embodiment of the disclosure.
Figure 3B:
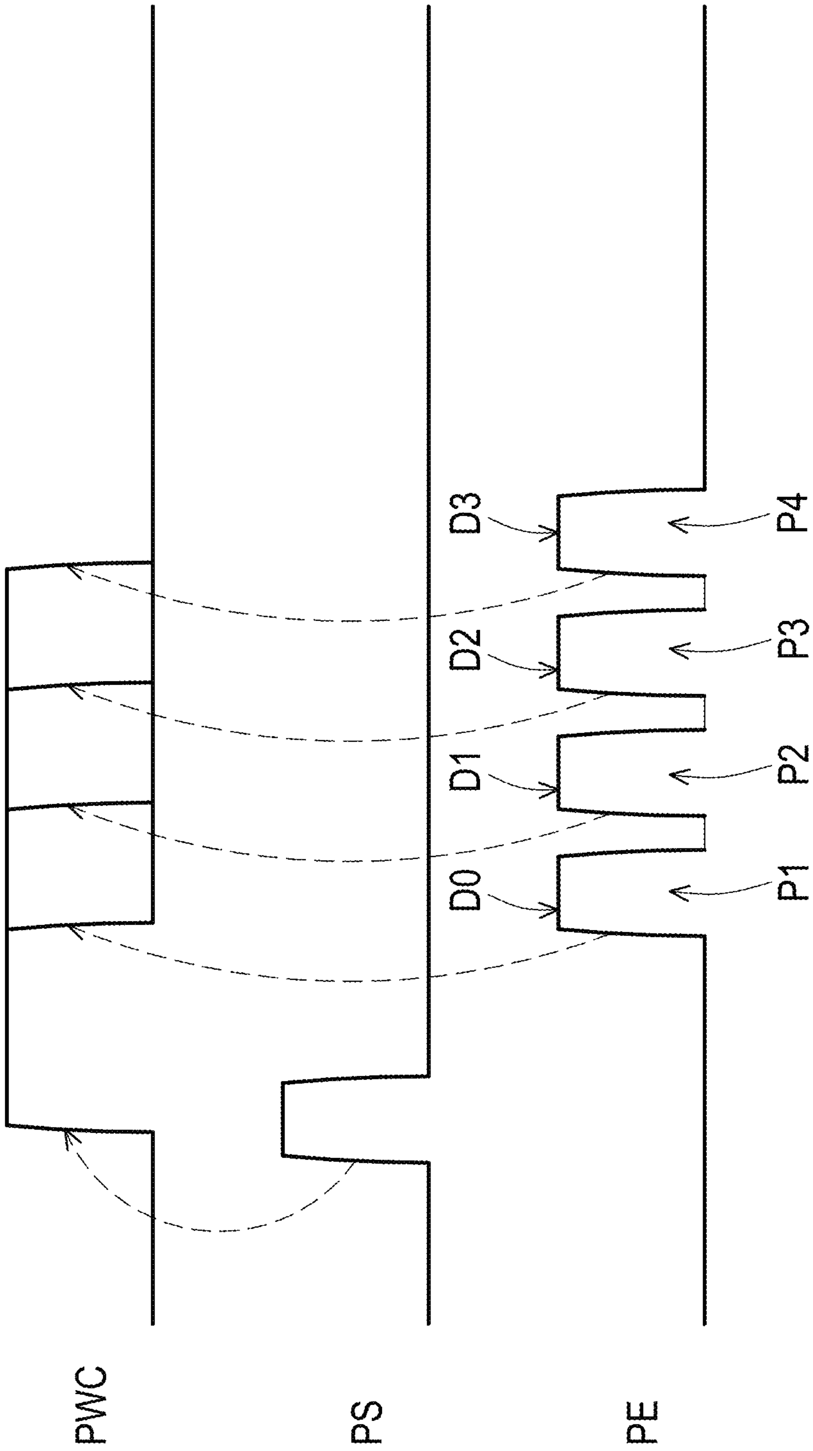
FIG. 3B is an operation waveform diagram of the controller of FIG. 3A.

Referring to FIG. 3A and FIG. 3B, FIG. 3A is a schematic diagram of an implementation of a controller of a memory device according to an embodiment of the disclosure, and FIG. 3B is an operation waveform diagram of the controller of FIG. 3A. In FIG. 3A, a controller 300 includes a delay string 310, a selector 320, and a logic circuit 330. The delay string 310 is configured to delay a pulse start signal PS to generate a plurality of delayed signals D0-D3. The controller 300 may generate the pulse start signal PS according to a time point at which the accessing operation of the memory cells occurs, where the pulse start signal PS may have a single pulse wave, as shown in FIG. 3B. The selector 320 is, for example, a multiplexer of any form without certain limitations.

The delay string 310 includes a plurality of buffers BF1-BF4. The buffers BF1-BF4 are coupled in series in sequence. The first-stage buffer BF1 receives the pulse start signal PS, and the buffers BF1-BF4 sequentially delay the pulse start signal PS to generate a plurality of delayed signals D0-D4 respectively.

The selector 320 receives the delayed signals D0-D4, and selects one of the delayed signals D0-D4 according to the most significant bit X[9:8] in the address information of the word line corresponding to the accessing operation to generate a pulse termination signal PE. In the embodiment, the selector 320 may select four delay signals D0-D3 according to the two bits X[9:8]. When the bits X[9:8]=0,0, the selector 320 selects the delayed signal D0 as the pulse termination signal PE; when the bits X[9:8]=0,1, the selector 320 selects the delayed signal D1 as the pulse termination signal PE; when the bits X[9:8]=1,0, the selector 320 selects the delayed signal D2 as the pulse termination signal PE; and when the bits X[9:8]=1,1, the selector 320 selects the delayed signal D3 as the pulse termination signal PE.

In FIG. 3B, the pulse termination signal PE may have one of pulse waves P1-P4. The pulse waves P1-P4 respectively correspond to the delayed signals D0-D3. Along with different logic values of the bits X[9:8], the pulse wave on the pulse termination signal PE and the pulse wave on the pulse start signal PS may have different time differences.

In addition, the logic circuit 330 may receive the pulse start signal PS and the pulse termination signal PE, and generate pulse width control information PWC according to the pulse start signal PS and the pulse termination signal PE. A pulse width of the pulse width control information PWC may be equal to a time difference between a rising edge of the pulse start signal PS and a rising edge of the pulse termination signal PE. The logic circuit 330 may include, for example, a set-reset latch (SR Latch).

Figure 4A:
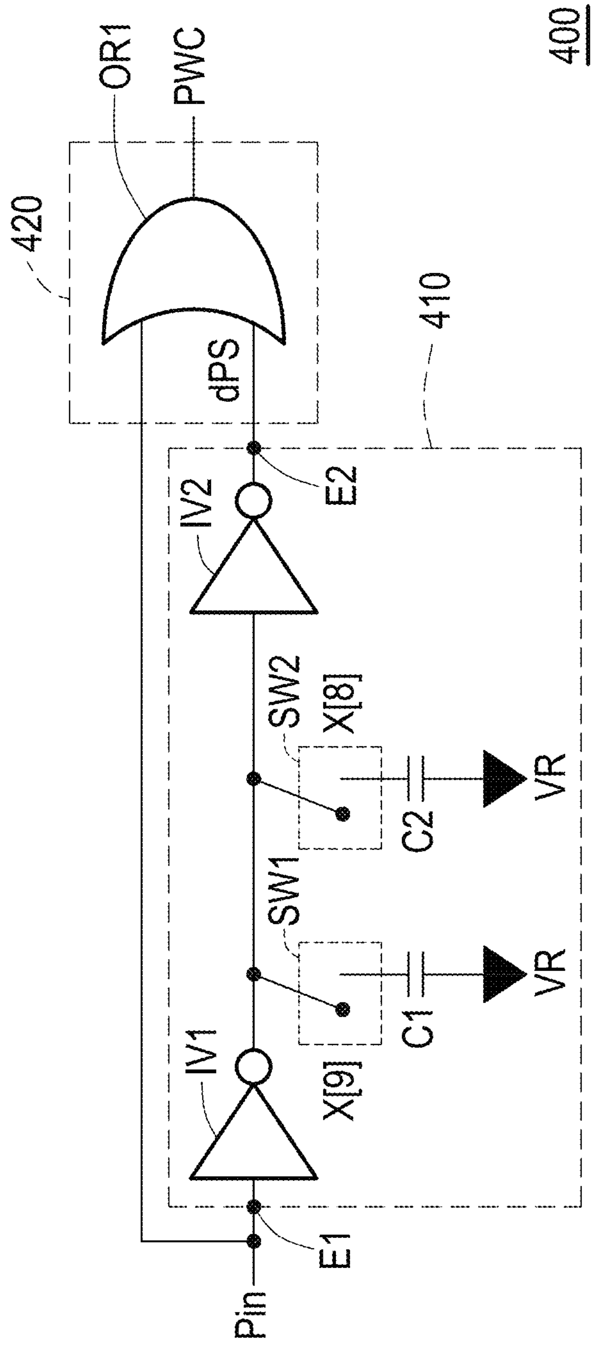
FIG. 4A is a schematic diagram of another implementation of a controller of a memory device according to an embodiment of the disclosure.
Figure 4B:
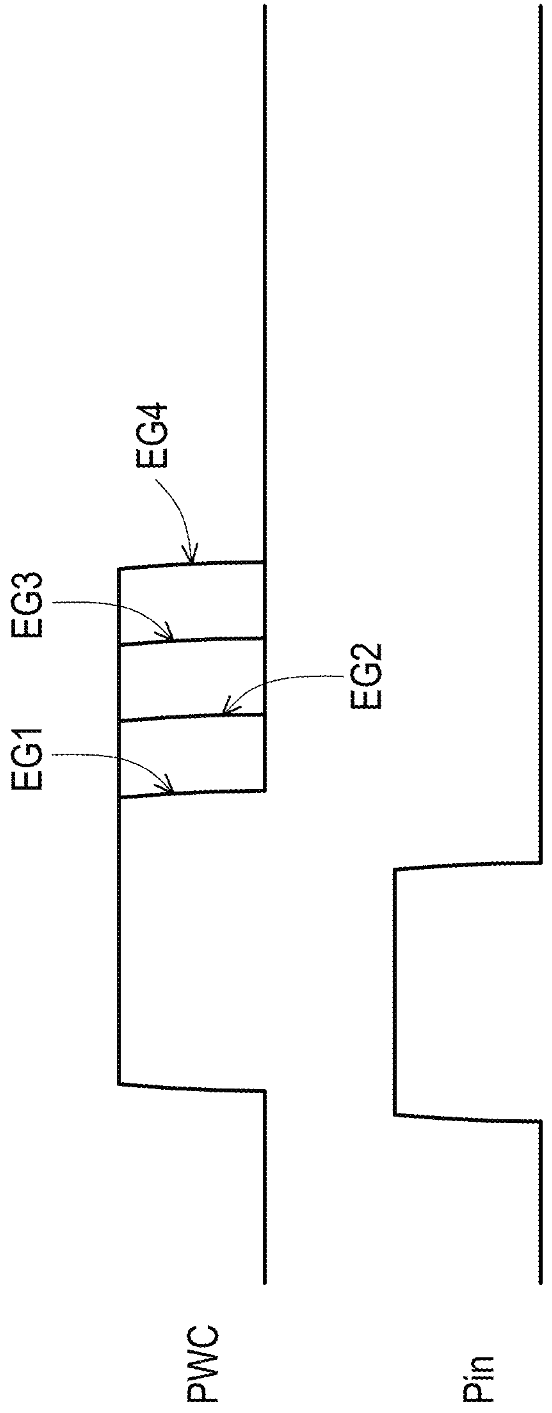
FIG. 4B is an operation waveform diagram of the controller of FIG. 4A.

Referring to FIG. 4A and FIG. 4B, FIG. 4A is a schematic diagram of another implementation of a controller of a memory device according to an embodiment of the disclosure, and FIG. 4B is an operation waveform diagram of the controller of FIG. 4A. In FIG. 4A, a controller 400 includes a delay string 410 and a logic gate 420. The delay string 410 is configured to delay a pulse input signal Pin to generate a delayed signal dPS. The controller 400 may generate the pulse input signal Pin according to a time point at which the accessing operation of the memory cell occurs, where the pulse input signal Pin may have a single pulse wave, as shown in FIG. 4B.

The delay string 410 includes a plurality of switches SW1 and SW2, capacitors C1 and C2, and buffers IV1 and IV2. The switches SW1 and SW2 are coupled between the two endpoints E1 and E2 of the delay string 410. The capacitors C1 and C2 respectively correspond to the switches SW1 and SW2 and are respectively coupled between the switches SW1 and SW2 and a reference voltage VR. The switches SW1 and SW2 are respectively controlled by the most significant bits X[9] and X[8] in the address information of the word line corresponding to the accessing operation, and are respectively turned-on/off according to the most significant bits X[9] and X[8]. In the embodiment, the capacitors C1 and C2 may be physical capacitors, or may also be formed through parasitic capacitances between components, without certain limitations.

In addition, the buffers IV1 and IV2 may be inverters. The buffer IV1 is coupled between the endpoint E1 and the switch SW1, and the buffer IV2 is coupled between the endpoint E2 and the switch SW2.

In the embodiment, when all the switches SW1 and SW2 are turned on, the maximum equivalent capacitance value between the endpoints E1 and E2 may be provided, and the maximum delay time may be provided. In contrast, when all the switches SW1 and SW2 are turned off, the minimum equivalent capacitance value between the endpoints E1 and E2 may be provided, and the minimum delay time may be provided.

In the embodiment, the capacitors C1 and C2 may have different capacitance values. For example, the capacitance value of the capacitor C1 may be twice of the capacitance value of the capacitor C2.

The logic gate 420 is configured to receive the pulse input signal Pin and the delayed signal dPS. The logic gate 420 performs logical operations on the pulse input signal Pin and the delayed signal dPS to generate the pulse width control information PWC. In the embodiment, the logic gate 420 may be an OR gate OR1.

In FIG. 4B, a rising edge of the pulse width control information PWC may be generated corresponding to a rising edge of the pulse input signal Pin, and a falling edge of the pulse width control information PWC may be adjusted corresponding to the bits X[9] and X[8]. When the bits X[9] and X[8] are equal to 0 and 0, the falling edge of the pulse width control information PWC is a falling edge EG1; when the bits X[9] and X[8] are equal to 0 and 1, the falling edge of the pulse width control information PWC is a falling edge EG2; when the bits X[9] and X[8] are equal to 1 and 0, the falling edge of the pulse width control information PWC is a falling edge EG3; and when the bits X[9] and X[8] are equal to 1 and 1, the falling edge of the pulse width control information PWC is a falling edge EG4. In the embodiment, when the bit X[9] is logic 1, it means that the corresponding switch SW1 is turned on; when the bit X[9] is logic 0, it means that the corresponding switch SW1 is turned off. Similarly, when the bit X[8] is logic 1, it means that the corresponding switch SW2 is turned on; and when bit X[8] is logic 0, it means that the corresponding switch SW2 is turned off.

In the embodiment, the number of the switches SW1 to SW2 and the capacitors C1 and C2 may be set according to the number of the most significant bits in the address information of the word line used by the controller 400, and there is no certain limitation. The two sets of switches SW1 to SW2 and capacitors C1 and C2 shown in FIG. 4A are only an example for illustration and are not intended to limit an implementation scope of the disclosure.

It should be noted that the buffers IV1 and IV2 in the embodiment may also be implemented as non-inverting buffers, and the logic gate OR1 may also be replaced with one or more combinations of other logic gates based on a logic operation principle. This conversion mechanism is well known to those with ordinary knowledge in the art and detail thereof is not repeated.

Figure 5:
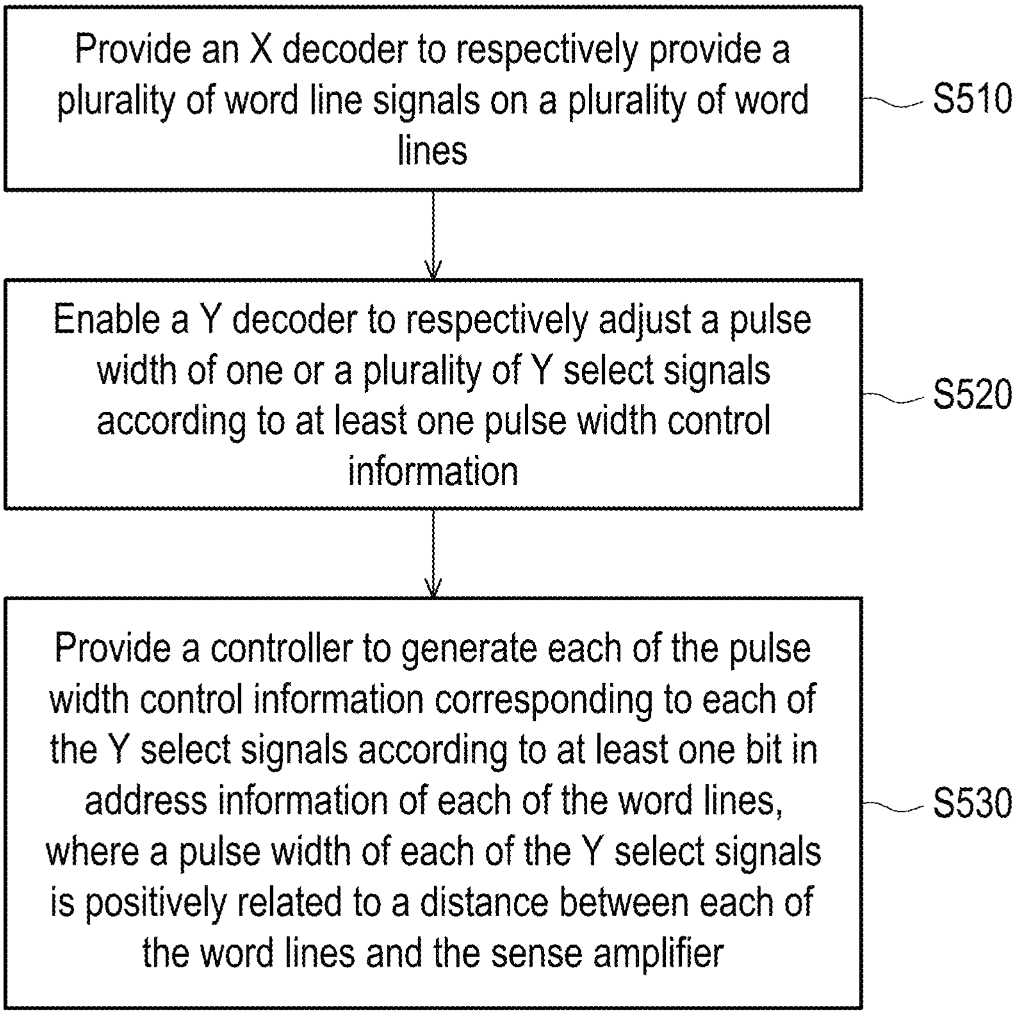
FIG. 5 is a flowchart of a word line signal generating method according to an embodiment of the disclosure.

Referring to FIG. 5 below, FIG. 5 is a flowchart of a word line signal generating method according to an embodiment of the disclosure. In step S510, the memory device provides a word line signal decoder (x decoder) to respectively provide a plurality of word line signals on a plurality of word lines. In step S520, the memory device enables a Y decoder to respectively adjust a pulse width of at least one Y select signal according to one or a plurality of pulse width control information. In step S530, the memory device provides a controller to generate each pulse width control information corresponding to each of the Y select signals according to at least one bit in address information of each of the word lines, where a pulse width of each of the Y select signals is positively related to a distance between each of the turned-on word lines and the sense amplifier.

The implementation details of the above steps have been described in detail in the previous embodiments, which will not be repeated.

In summary, the memory device of the disclosure may adjust a maintaining time length of the pulse wave on the Y select signal according to the position of the word line of the memory cell to be accessed. In the way, the memory device may adaptively adjust the operation time of the accessing operation of the memory cells of the word lines at different positions, which effectively improves the working efficiency of the memory device.

What is claimed is:

1. A memory device, comprising:

a memory cell array, coupled to a plurality of word lines;

an X decoder, respectively providing a plurality of word line signals on the word lines;

a Y decoder, adjusting a pulse width of one or a plurality of Y select signals according to at least one pulse width control information;

a sense amplifier, coupled to one side of the memory cell array through a plurality of bit lines; and a controller, coupled to the X decoder and the Y decoder, and generating each of the pulse width control information corresponding to each of the Y select signals according to at least one bit of address information of each of the word lines, wherein the pulse width of each of the Y select signals is positively related to a distance between each of the word lines and the sense amplifier, wherein the controller comprises:

a logic gate, having a first input terminal to receive a pulse input signal; and a delay string, having a first end to receive the pulse input signal, and a second end of the delay string being coupled to a second input terminal of the logic gate, wherein the delay string provides a time delay according to the at least one bit, wherein the delay string comprises:

at least one switch, coupled between the first end of the delay string and the second end of the delay string, and controlled by the at least one bit to be turned on or off; and at least one capacitor, coupled between the at least one switch and a reference voltage.

2. The memory device as claimed in claim 1, wherein the at least one bit is a most significant bit in the address information of each of the word lines that is turned on.

3. The memory device as claimed in claim 1, wherein the controller generates the pulse input signal, generates the time delay according to the at least one bit, and generates each of the pulse width control information corresponding to each of the Y select signals by delaying the pulse input signal by the time delay.

4. The memory device as claimed in claim 1, wherein the delay string further comprises:

a first buffer, coupled between the first end and the at least one switch; and a second buffer, coupled between the second end and the at least one switch.

5. The memory device as claimed in claim 1, wherein when a number of the at least one capacitor is plural, capacitance values of the capacitors are not equal to each other.

6. A word line signal generating method, comprising:

providing an X decoder to respectively provide a plurality of word line signals on a plurality of word lines;

enabling a Y decoder to respectively adjust a pulse width of one or a plurality of Y select signals according to at least one pulse width control information;

providing a controller to generate each of the pulse width control information corresponding to each of the Y select signals according to at least one bit in address information of each of the word lines, comprising:

receiving a pulse input signal by a first input terminal of a logic gate;

providing at least one switch and at least one capacitor to be coupled in series between a delay string and a reference voltage;

receiving the pulse input signal by a first end of the delay string, and coupling a second end of the delay string to a second input terminal of the logic gate;

providing a time delay by the delay string by turning on or off the at least one switch according to the at least one bit; and generating each of the pulse width control information corresponding to each of the Y select signals by delaying the pulse input signal by the time delay, wherein the pulse width of each of the Y select signals is positively related to a distance between each of the word lines and a sense amplifier.

7. The word line signal generating method as claimed in claim 6, wherein the at least one bit is a most significant bit in the address information of each of the word lines.

* * * * *